(12) United States Patent
Liu et al.

(10) Patent No.: US 12,720,827 B2
(45) Date of Patent: Aug. 25, 2026

(54) EPITAXIAL STRUCTURES GROWN ON MATERIAL WITH A CRYSTALLOGRAPHIC ORIENTATION OF {110}

(71) Applicant: Taiwan Semiconductor Manufacturing Company, Ltd., Hsinchu (TW)

(72) Inventors: Wei-Min Liu, Hsinchu (TW); Tsz-Mei Kwok, Hsinchu (TW); Yung-Chun Yang, Taipei (TW); Cheng-Yen Wen, Taichung (TW); Li-Li Su, Hsinchu (TW); Chii-Horng Li, Hsinchu (TW); Yee-Chia Yeo, Hsinchu (TW); Hui-Lin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 895 days.

(21) Appl. No.: 17/660,818

(22) Filed: Apr. 26, 2022

(65) Prior Publication Data

US 2023/0343819 A1 Oct. 26, 2023

(51) Int. Cl.
*H10D 62/40* (2025.01)
*H10P 14/20* (2026.01)
(Continued)

(52) U.S. Cl.
CPC ....... *H10D 62/405* (2025.01); *H10P 14/3466* (2026.01); *H10P 50/28* (2026.01); *H10P 50/691* (2026.01)

(58) Field of Classification Search
CPC .... H10D 62/405; H10D 30/62; H10D 30/024; H10D 62/109; H10D 30/6735; H10D 30/6219; H10D 84/0158; H10D 84/0193; H10D 84/834; H10D 84/853; H10D 30/501; H10D 62/822; H10D 62/121; H10D 62/151; H10D 62/116; H10D 62/01; H10D 62/052; H10D 62/149; H10D 30/6757; H10D 30/797; H10D 30/014; H10D 30/43; H10D 30/019; H10D 30/0195;
(Continued)

(56) References Cited

U.S. PATENT DOCUMENTS 9,437,496 B1 * 9/2016 Chudzik .............. H10D 30/024
9,570,556 B1 * 2/2017 Lee ........................ H10D 30/62
(Continued)

FOREIGN PATENT DOCUMENTS

TW 200925340 A 6/2009

*Primary Examiner* — Julio J Maldonado
*Assistant Examiner* — Paul A Berry
(74) *Attorney, Agent, or Firm* — Ingrassia Fisher & Lorenz, LLP | IF&L

(57) ABSTRACT

Provided is an epitaxial structure and a method for forming such a structure. The method includes forming a fin structure on a substrate, wherein the fin structure includes a semiconductor material having substantially a {110} crystallographic orientation. The method includes etching a portion of the fin structure to expose a sidewall portion of the semiconductor material. Further, the method includes growing an epitaxial structure on the sidewall of the semiconductor material, wherein the epitaxial structure propagates with facets having a {110} crystallographic orientation.

20 Claims, 17 Drawing Sheets

(51) Int. Cl.
*H10P 50/00* (2026.01)
*H10P 50/28* (2026.01)

(58) Field of Classification Search
CPC ............. H10D 84/103; H10D 84/0133; H10D 84/017; H10D 84/0186; H10D 84/8312; H10D 84/83125; H01L 21/02609; H01L 29/0635; H01L 21/823814; H01L 21/0259; H01L 21/0332; H01L 21/28518; H01L 29/0673; H01L 29/7848; H01L 29/6656; H10P 14/3466
See application file for complete search history.

(56) References Cited

U.S. PATENT DOCUMENTS

2010/0148174 A1 6/2010 Nakahata et al.
2017/0148907 A1* 5/2017 Wu ...................... H10D 30/024
2018/0053690 A1* 2/2018 Wang ................... H10D 84/014
2018/0358435 A1* 12/2018 Mochizuki ......... H10D 30/6757
2020/0365692 A1* 11/2020 Jung .................... H10D 62/118
2021/0098304 A1* 4/2021 Chang .................. H10D 64/017
2021/0391423 A1 12/2021 Lin et al.
2022/0199773 A1* 6/2022 Rachmady ........... H10D 64/021

* cited by examiner

EPITAXIAL STRUCTURES GROWN ON MATERIAL WITH A CRYSTALLOGRAPHIC ORIENTATION OF {110}

BACKGROUND

The semiconductor integrated circuit (IC) industry has experienced exponential growth. Technological advances in IC materials and designs have produced generations of ICs where each generation has smaller and more complex circuits than the previous generation. As the semiconductor IC industry has progressed into nanometer technology nodes in pursuit of higher device density, higher performance, and lower costs, challenges from both fabrication and design issues have resulted in the development of three-dimensional designs, such as a Fin Field Effect Transistor (FinFET) devices.

FinFET devices typically include semiconductor fins with high aspect ratios. A gate structure is formed over and along the sides of the fin, utilizing the advantage of the increased surface area of the FinFET channel to produce faster, more reliable, and better-controlled semiconductor transistor devices. In the development of FinFET devices, the gate structure may be developed into a gate-all-around (GAA) structure. However, since device feature sizes continue to decrease, fabrication processes continue to become more difficult to perform. There are still various challenges in the fabrication of FinFET devices with GAA structures.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

DETAILED DESCRIPTION

Figure 1:
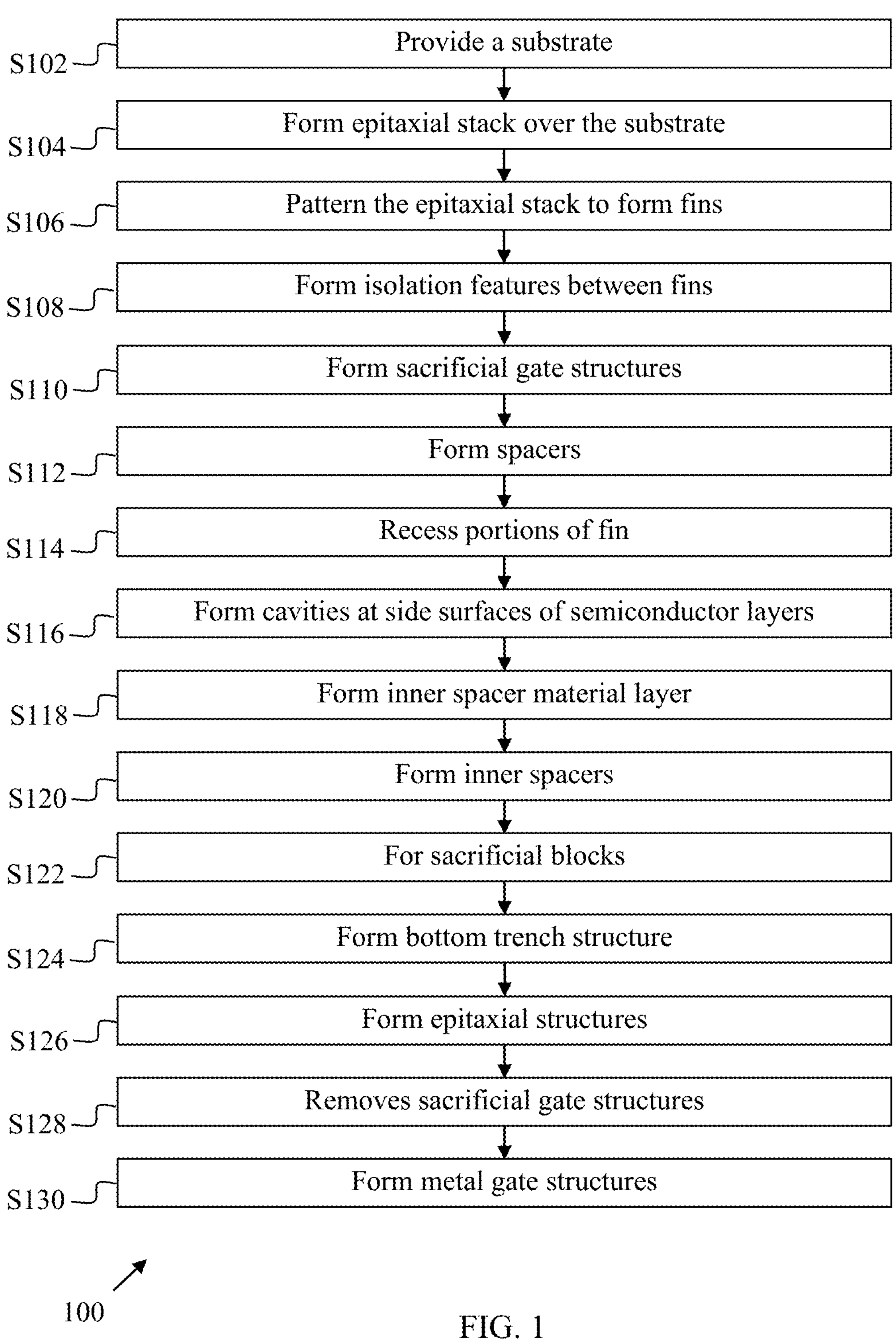
FIG. 1 illustrates a flow chart of a method for forming a semiconductor device according to various aspects of the present disclosure.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Certain embodiments herein are generally related to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as a gate-all-around (GAA) device. A GAA device includes any device that has its gate structure, or portion thereof, formed on 4-sides of a channel region (e.g., surrounding a portion of a channel region).

Structures presented herein also include embodiments that have channel regions in the form of nanosheets. The term "nanosheet" designates any material portion with nanoscale, or even microscale dimensions, and having an elongate shape, regardless of the cross-sectional shape of this portion. Thus, this term designates both circular and substantially circular cross-section elongate material portions, e.g., nanowires, and beam or bar-shaped material portions including for example a cylindrical or substantially rectangular cross-section.

Presented herein are embodiments that may have one or more channel regions associated with a single, contiguous gate structure. However, one of ordinary skill would recognize that the teaching can apply to a single channel region or any number of channel regions. One of ordinary skill may recognize other examples of semiconductor devices that may benefit from aspects of the present disclosure.

Certain embodiments disclosed herein relate to epitaxial structures, such as source/drain regions, grown on the sidewalls of semiconductor material that forms channel regions. In certain embodiments, the substrate underlying the structure is a semiconductor material that has a (110) crystallographic orientation and the epitaxial structures are formed with a (110) crystallographic orientation. Accordingly, during epitaxial growth, the epitaxial structure propagates with facets having a {110} crystallographic orientation.

Certain embodiments disclosed herein relate generally to fabricating semiconductor devices in which epitaxial structures are formed with greater integrity, i.e., with fewer plane defects or voids. For example, epitaxial source/drain regions may be formed with fewer plane defects or voids.

Further, certain embodiments herein provide for the formation of lateral air gaps, i.e., air gaps at the sides of the epitaxial structure, that may reduce parasitic capacitance.

Moreover, certain embodiments herein provide for the formation of a bottom air gap, i.e., an air gap below the epitaxial structure, that may reduce parasitic capacitance.

Also, certain embodiments provide for epitaxial formation of structures with a lower raised height, as compared to conventional epitaxial processes.

Referring now to the Figures, FIG. 1 illustrates a flow chart of a method 100 for forming a structure, such as a multi-gate device, according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as a "nanosheet".

FIG. 1 is described in conjunction with FIGS. 2-16, 17A-17D and 19-20 which illustrate a semiconductor device 200 at various stages of fabrication in accordance with some embodiments of the present disclosure of the method 100. The method 100 is merely an example, and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device depicted in the Figures and some of the features described below can be replaced, modified, or eliminated in other embodiments of the semiconductor device.

As with the other method embodiments and exemplary devices discussed herein, it is understood that parts of the semiconductor device 200 may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to the Figures, as with the remainder of the method and exemplary figures provided in this disclosure, are merely exemplary and are not intended to be limiting beyond what is specifically recited in the claims that follow.

Figure 2:
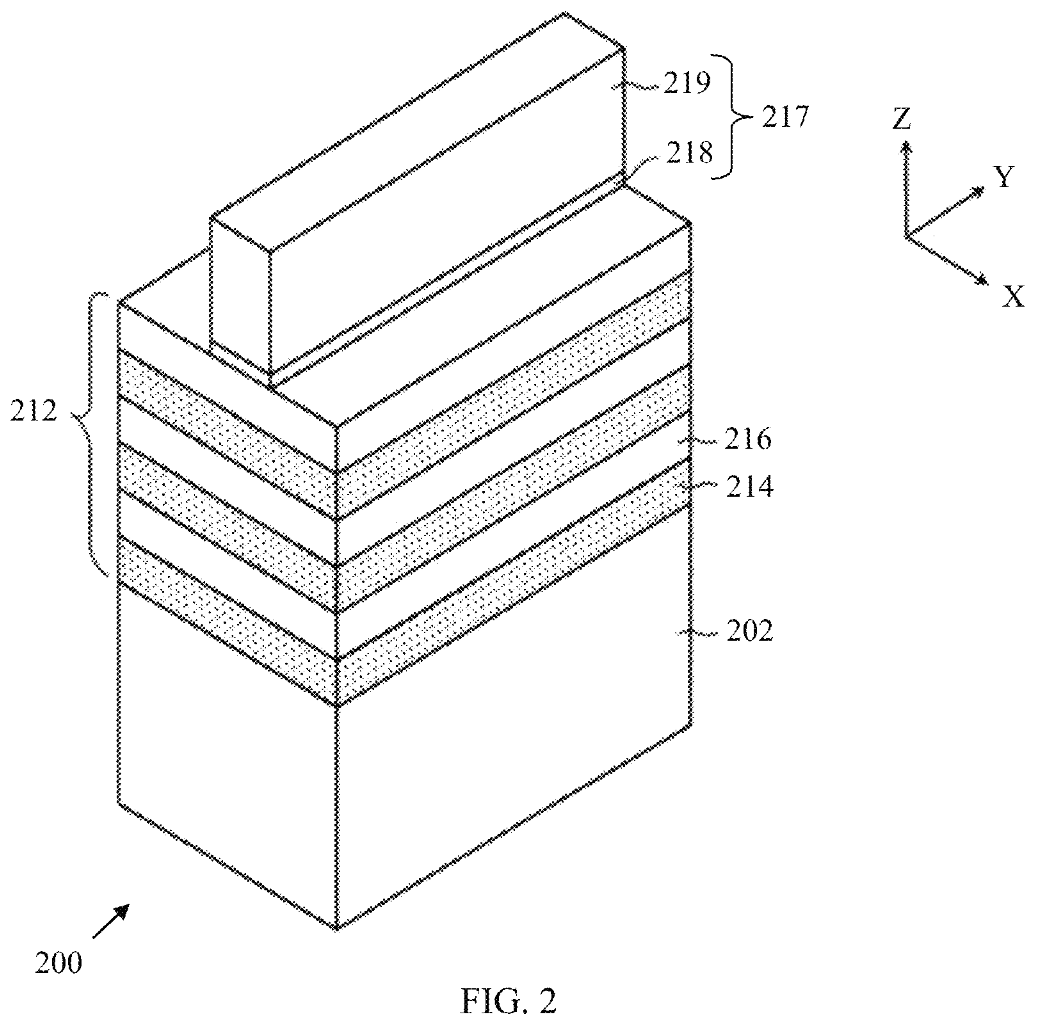
FIGS. 2-5 are diagrammatic perspective views of a semiconductor device at other various stages of fabrication in accordance with some embodiments of the present disclosure.

At operation S102, the method 100 (FIG. 1) provides a substrate 202, as shown in FIG. 2. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., p-well, n-well) may be formed on the substrate 202 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. In the illustrated embodiment, the substrate 202 is made of crystalline Si.

In exemplary embodiments, the substrate 202 has a {110} crystallographic orientation.

As shown in FIG. 2, at operation S104, the method 100 (FIG. 1) forms one or more epitaxial layers over the substrate 202. In some embodiments, an epitaxial stack 212 is formed over the substrate 202. The epitaxial stack 212 includes epitaxial layers 214 of a first composition interposed by epitaxial layers 216 of a second composition. The first and second composition may be different. Embodiments are possible including those that provide for a first composition and a second composition having different oxidation rates and/or etch selectivity. In an embodiment, the epitaxial layers 214 are SiGe and the epitaxial layers 216 are silicon. In embodiments wherein the epitaxial layer 214 includes SiGe and the epitaxial layer 216 includes silicon, the silicon oxidation rate is less than the SiGe oxidation rate. It is noted that three layers of epitaxial layers 214 and three layers of epitaxial layers 216 are illustrated in FIG. 2, which is for illustrative purposes only and not intended to be limiting beyond what is specifically recited in the claims. It can be appreciated that any number of epitaxial layers may be formed in the epitaxial stack 212; the number of layers depending on the desired number of channels regions for the GAA device 200. In some embodiments, the number of epitaxial layers 216 is between two and ten, such as six or seven.

In exemplary embodiments, each layer 214 and 216 has a {110} crystallographic orientation. Such orientation may result from epitaxial growth of the respective layer on an underlying layer having the {110} crystallographic orientation.

In some embodiments, the epitaxial layer 214 has a thickness ranging from about 5 nm to about 15 nm. The epitaxial layers 214 may be substantially uniform in thickness. In some embodiments, the epitaxial layer 216 has a thickness ranging from about 5 nm to about 15 nm. In some embodiments, the epitaxial layers 216 of the stack are substantially uniform in thickness. As described in more detail below, the epitaxial layer 216 may serve as channel region(s) for a subsequently formed multi-gate device and has a thickness chosen based on device performance considerations. The epitaxial layer 214 may serve to define a gap between adjacent channel region(s) for a subsequently formed multi-gate device and has a thickness chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 216 include the same material as the substrate 202. In some embodiments, the epitaxially grown layers 214 and 216 include a different material than the substrate 202. As stated above, in at least some examples, the epitaxial layer 214 includes an epitaxially grown $Si_{1-x}Ge_x$ layer (wherein x is from about 10 to about 55%) and the epitaxial layer 216 includes an epitaxially grown silicon (Si) layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation, etch selectivity properties. In various embodiments, the epitaxial layers 214 and 216 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. In some embodiments, the bottom layer and the top layer of the epitaxial stack 212 are SiGe layers (not shown). In alternative embodiments, the bottom layer of the epitaxial stack 212 is a Si layer and the top layer of the epitaxial stack 212 is a SiGe layer (not shown).

Figure 3:
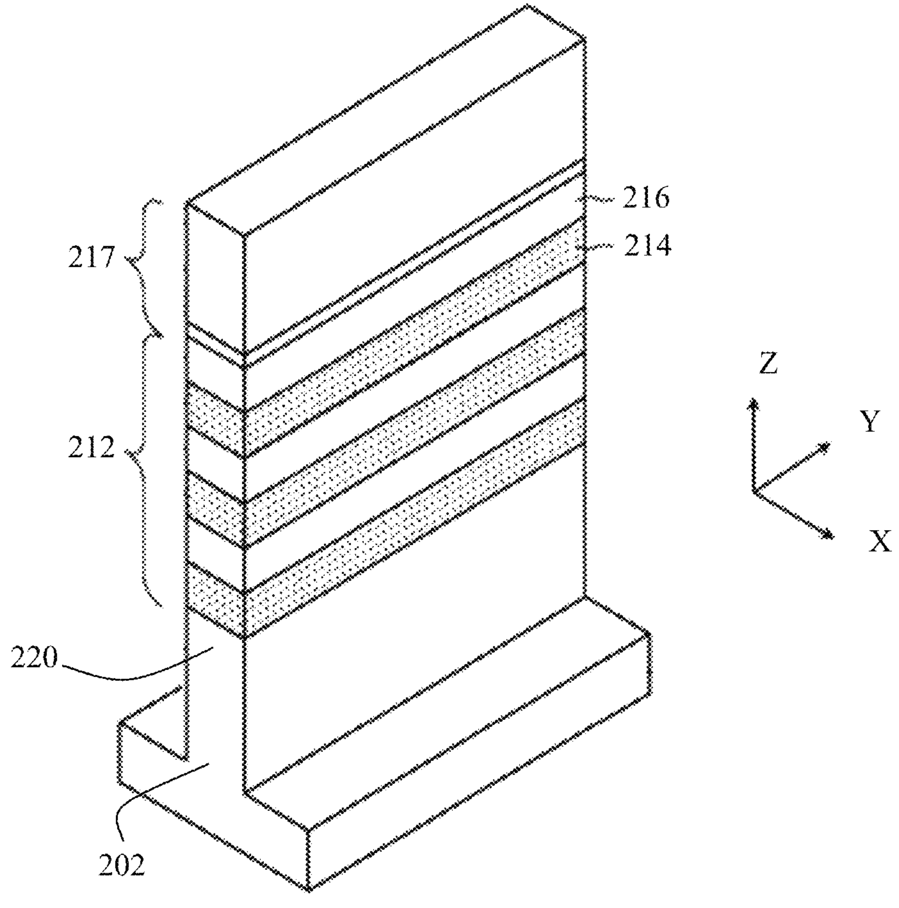

As shown in FIG. 3, at operation S106, the method 100 (FIG. 1) patterns the epitaxial stack 212 to form a semiconductor fin 220. In some embodiments, the operation S106 includes forming a mask layer 217 over the epitaxial stack 212, as shown in FIG. 2. The mask layer 217 includes a first mask layer 218 and a second mask layer 219. An exemplary first mask layer 218 is a pad oxide layer made of a silicon oxide, which may be formed by a thermal oxidation. An exemplary second mask layer 219 is made of a silicon nitride (SiN), which may be formed by chemical vapor deposition (CVD), including low pressure CVD (LPCVD) and plasma enhanced CVD (PECVD), physical vapor deposition (PVD), atomic layer deposition (ALD), or other suitable process. The mask layer 217 is patterned into a mask pattern by using patterning operations including photolithography and etching. Operation S106 subsequently patterns the epitaxial stack 212 in an etching process, such as a dry etch (e.g., reactive ion etching), a wet etch, and/or other suitable process, through openings defined in the patterned mask layer 217. The stacked epitaxial layers 214 and 216 are thereby patterned into the fin 220. While FIG. 3 illustrates the formation of one fin 220, any suitable number of the fins may be formed. Trenches are etched between adjacent fins 220.

In various embodiments, each fin 220 includes an upper portion of the interleaved epitaxial layers 214 and 216, and a bottom portion that is formed from the etched substrate 202. Each fin 220 protrudes upwardly in the z-direction from the substrate 202 and extends lengthwise in the y-direction. Sidewalls of each fin 220 may be straight or inclined (not shown). In FIG. 3, additional fins would be spaced apart along the x-direction. The fins 220 may have a same width or different widths.

Figure 4:
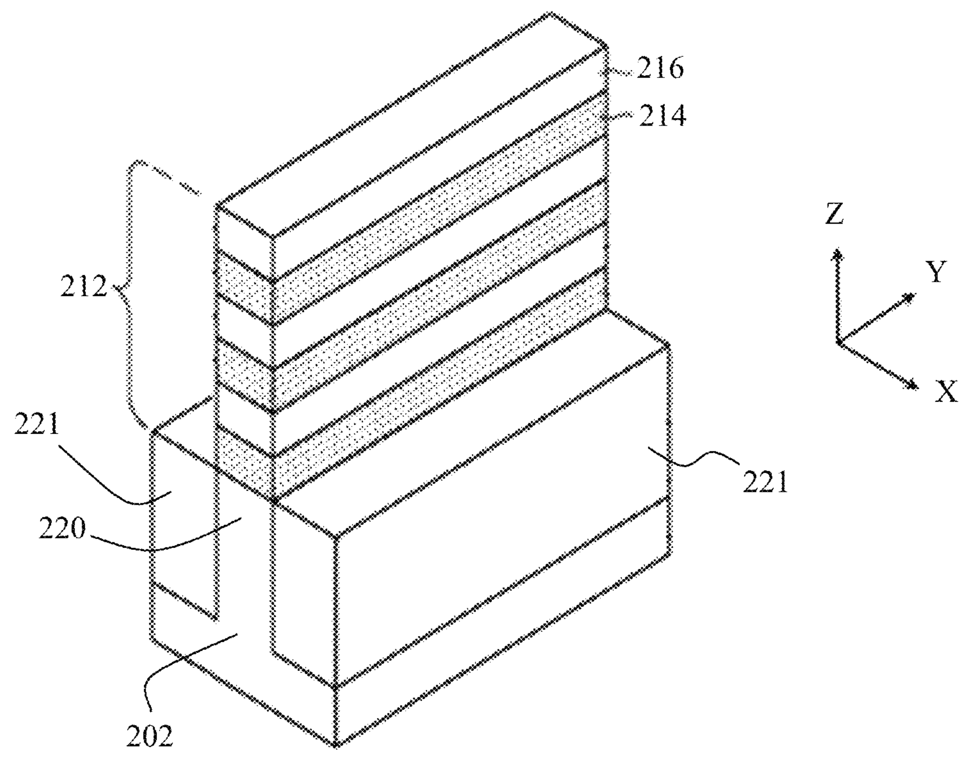

As shown in FIG. 4, at operation S108, the method 100 (FIG. 1) forms shallow trench isolation (STI) features (also denoted as STI features) 221 in trenches adjacent to each fin 220 with a dielectric layer. The STI features 221 may be formed by first filling the trenches around each fin 220 with a dielectric material layer to cover top surfaces and sidewalls of the fin 220 (not shown). The dielectric material layer may include one or more dielectric materials. Suitable dielectric materials for the dielectric layer may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The dielectric material layer is then planarized by using, for example, chemical mechanical planarization (CMP), until top surfaces of the mask layer 217 are revealed, and the dielectric material layer is recessed to form the shallow trench isolation (STI) features (also denoted as STI features) 221, as shown in FIG. 4. In the illustrated embodiment, the STI features 221 are formed on the substrate 202. Any suitable etching technique may be used to recess the isolation features 221 including dry etching, wet etching, RIE, and/or other etching methods, and in an exemplary embodiment, an anisotropic dry etching is used to selectively remove the dielectric material of the isolation features 221 without etching the fin 220. The mask layer 217 (shown in FIG. 3) may also be removed before, during, and/or after the recessing of the isolation features 221. In some embodiments, the mask layer 217 is removed by the CMP process performed prior to the recessing of the isolation features 221. In some embodiments, the mask layer 217 is removed by an etchant used to recess the isolation features 221.

Figure 5:
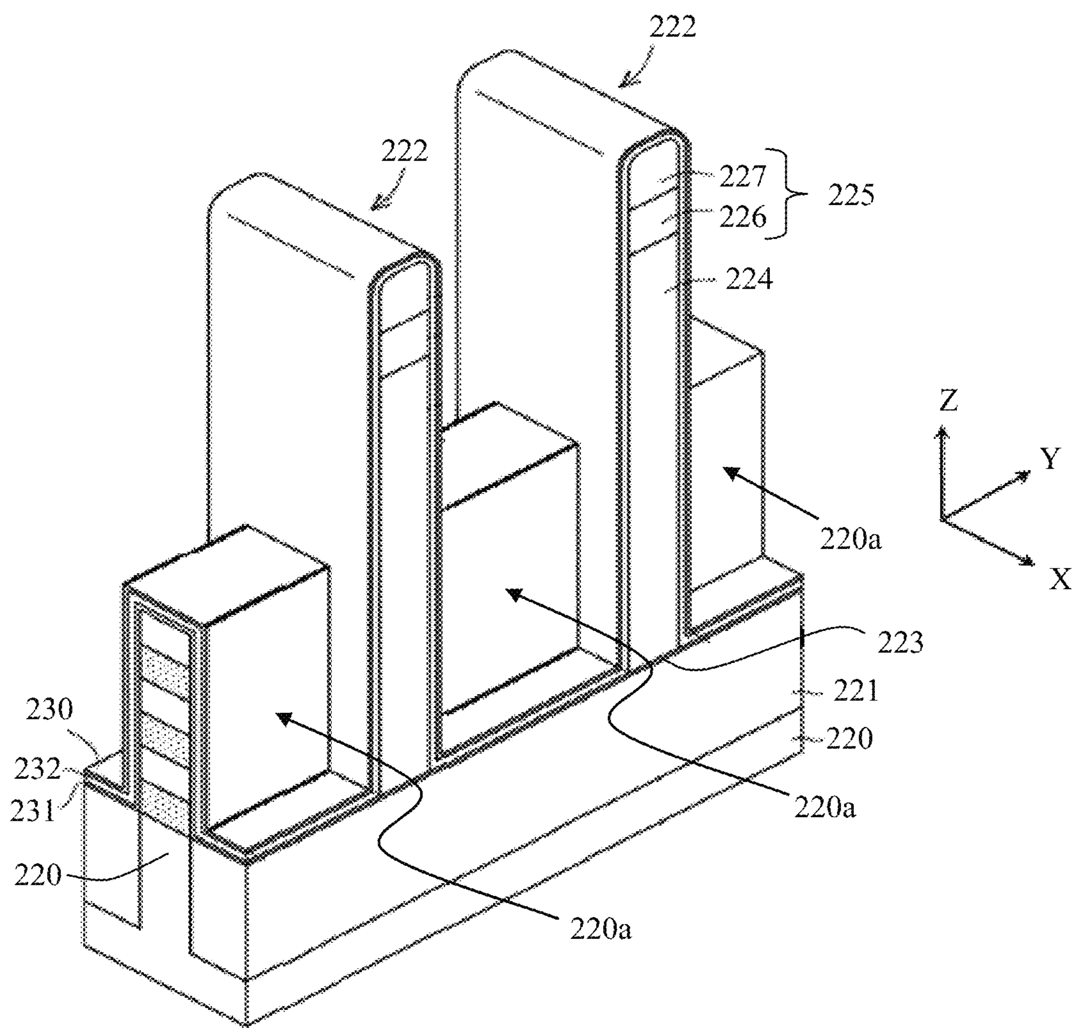

As shown in FIG. 5, at operation S110, the method 100 (FIG. 1) forms sacrificial (dummy) gate structures 222. The sacrificial gate structures 222 are formed over portions of the fin 220 which are to be channel regions. The sacrificial gate structures 222 may extend over a number of adjacent fins (not shown). The sacrificial gate structures 222 lie directly over and define the channel regions of the GAA devices to be formed. Each of the sacrificial gate structures 222 includes a sacrificial gate dielectric 223 and a sacrificial gate electrode 224 over the sacrificial gate dielectric 223. As shown, the gate structures 222 extend lengthwise in the x-direction and are spaced apart in the y-direction.

The sacrificial gate structures 222 are formed by first blanket depositing a sacrificial gate dielectric layer over the fin(s) 220. A sacrificial gate electrode layer is then blanket deposited on the sacrificial gate dielectric layer and over the fin(s) 220. The sacrificial gate dielectric layer includes silicon oxide, silicon nitride, or a combination thereof. The thickness of the sacrificial gate electrode layer is in a range from about 100 nm to about 200 nm in some embodiments. The sacrificial gate electrode layer 224 includes silicon such as polycrystalline silicon or amorphous silicon. The thickness of the sacrificial gate dielectric layer is in a range from about 1 nm to about 5 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. A mask layer 225 is formed over the sacrificial gate electrode layer. The mask layer 225 may include a mask layer 226 such as silicon oxide and a mask layer 227 such as silicon nitride. Subsequently, a patterning operation is performed on the mask layer 225, the sacrificial gate electrode layers and the sacrificial gate dielectric layer are patterned into the sacrificial gate structures 222, including sacrificial gate dielectric layer 223 and sacrificial gate electrode 224.

As shown, the fin 220 is partially exposed between and on opposite sides of the sacrificial gate structures 222, thereby defining source/drain (S/D) regions. In this disclosure, a source and a drain are interchangeably used and the structures thereof are substantially the same.

Still referring to FIG. 5, at operation S112, the method 100 (FIG. 1) forms spacers 230 on sidewalls of the sacrificial gate structures 222 and sidewalls of the fins 220 by depositing spacer materials and followed by an etching. The spacers 230 may include spacer material such as silicon oxide, silicon nitride, silicon carbide, silicon oxynitride, SiCN films, silicon oxycarbide, SiOCN films, and/or combinations thereof. In some embodiments, each of the spacers 230 include multiple layers, such as a liner layer 231 and a main spacer layer 232 on a sidewall of the liner layer 231.

By way of example, the spacers 230 may be formed by depositing spacer material including a liner material layer and a dielectric material layer over the sacrificial gate structure 222 using processes such as a subatmospheric CVD (SACVD) process, a flowable CVD process, an ALD process, a PVD process, or other suitable process respectively.

Figure 6A:
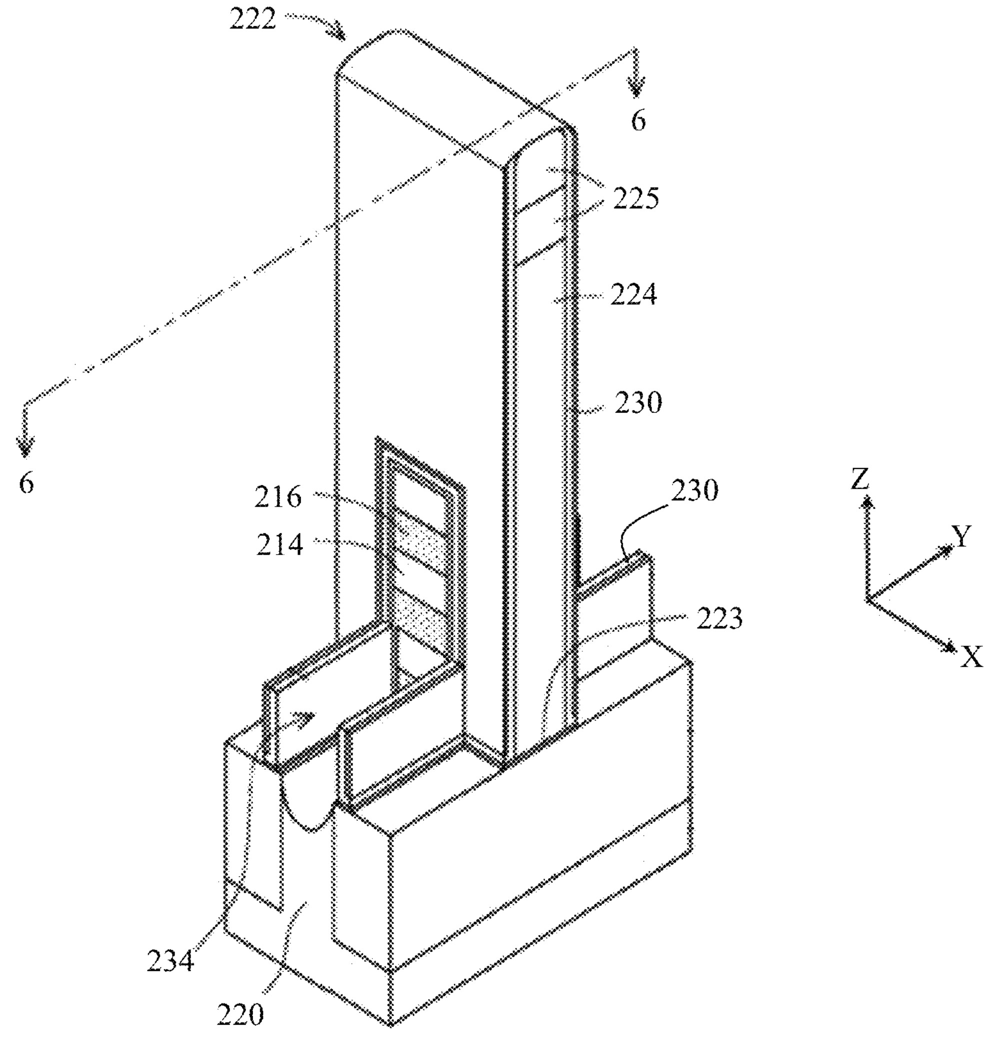
FIG. 6A is a diagrammatic perspective view of a portion of the semiconductor device of FIG. 5 at a further stage of fabrication in accordance with some embodiments of the present disclosure.

As shown in FIG. 6A, the deposition of the liner material layer and the dielectric material layer are followed by an etching-back (e.g., anisotropically) process to expose, and remove, portions 220*a* of the fins 220 adjacent to and not covered by the sacrificial gate structure 222 (e.g., S/D regions). The liner material layer and the dielectric material layer may remain on the sidewalls of the sacrificial gate structure 222 as the gate sidewall spacers 230, and on the sidewalls of the fins as the fin sidewall spacers 230. In some embodiments, the etching-back process may include a wet etch process, a dry etch process, a multiple-step etch process, and/or a combination thereof. The spacers 230 may have a thickness ranging from about 5 nm to about 20 nm.

Figure 6B:
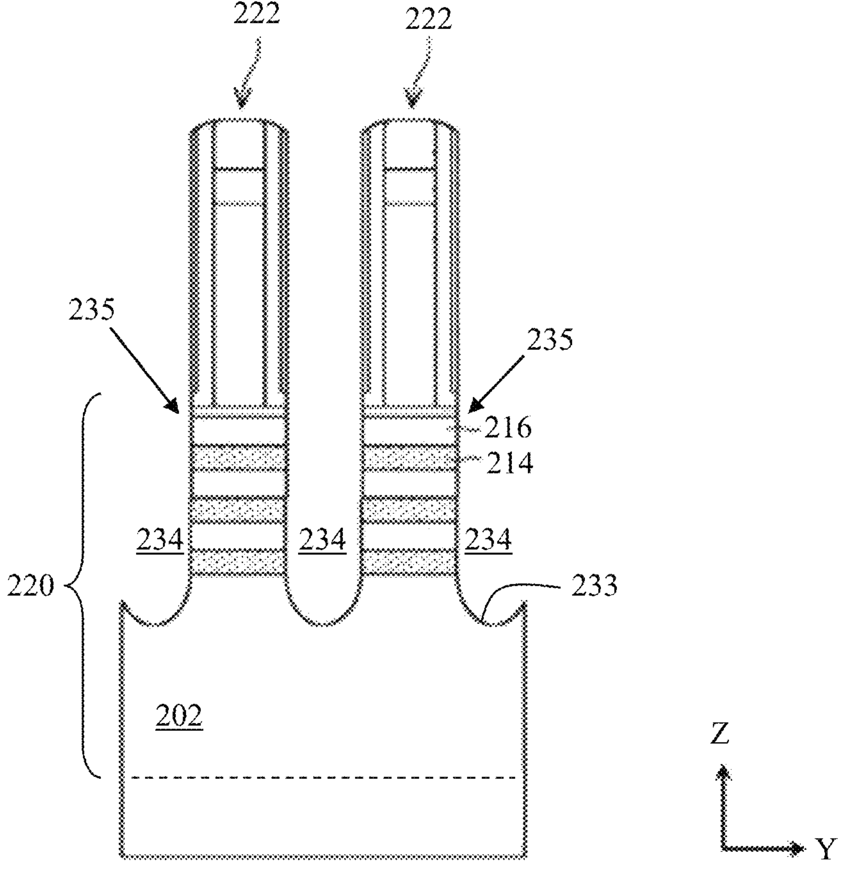
FIG. 6B is a cross-sectional view, taken along the y-axis, of the semiconductor device of FIG. 5 at the same stage of fabrication as FIG. 6A in accordance with some embodiments of the present disclosure.

Cross-referencing FIG. 6A with FIG. 6B, at operation S114, the method 100 (FIG. 1) recesses the portions of the fin 220 not covered by the sacrificial gate structures 222 to form gaps or recesses 234 in the S/D regions. It is noted that FIG. 6A shows only one sacrificial gate structure 222 and the adjacent portion of fin 220 so that etching of the S/D region between the sacrificial gate structures 222 of FIG. 5 may be more clearly viewed. FIG. 6B is a cross sectional-view along line 6-6 in FIG. 6A but, like FIG. 5, FIG. 6B illustrates both sacrificial gate structures 222 and the fin 220 adjacent to both sacrificial gate structures 222.

As shown most clearly in FIG. 6B, the stacked epitaxial layers 214 and 216 and an upper portion of substrate 202 forming fin 220 are etched down at the S/D regions. As a result, a bottom gap surface 233 is formed in the fin 220. In many embodiments, the operation S116 forms the gaps 234 by a suitable etching process, such as a dry etching process, a wet etching process, or a combination thereof. As a result of the etching process, fin segments 235 of the upper portion of the fin 220 are defined and separated from one another by the gaps 234.

Figure 7A:
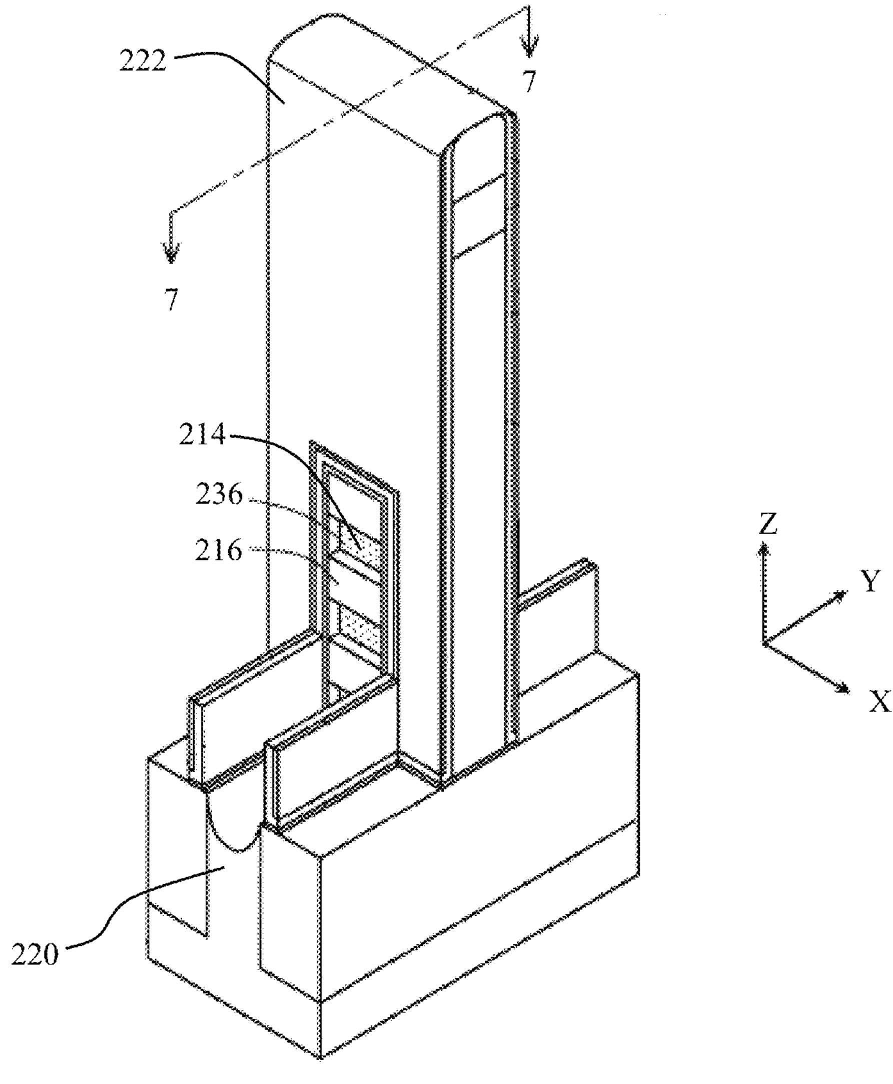
FIG. 7A is a diagrammatic perspective view of a portion of the semiconductor device of FIG. 5 at a further stage of fabrication in accordance with some embodiments of the present disclosure.
Figure 7B:
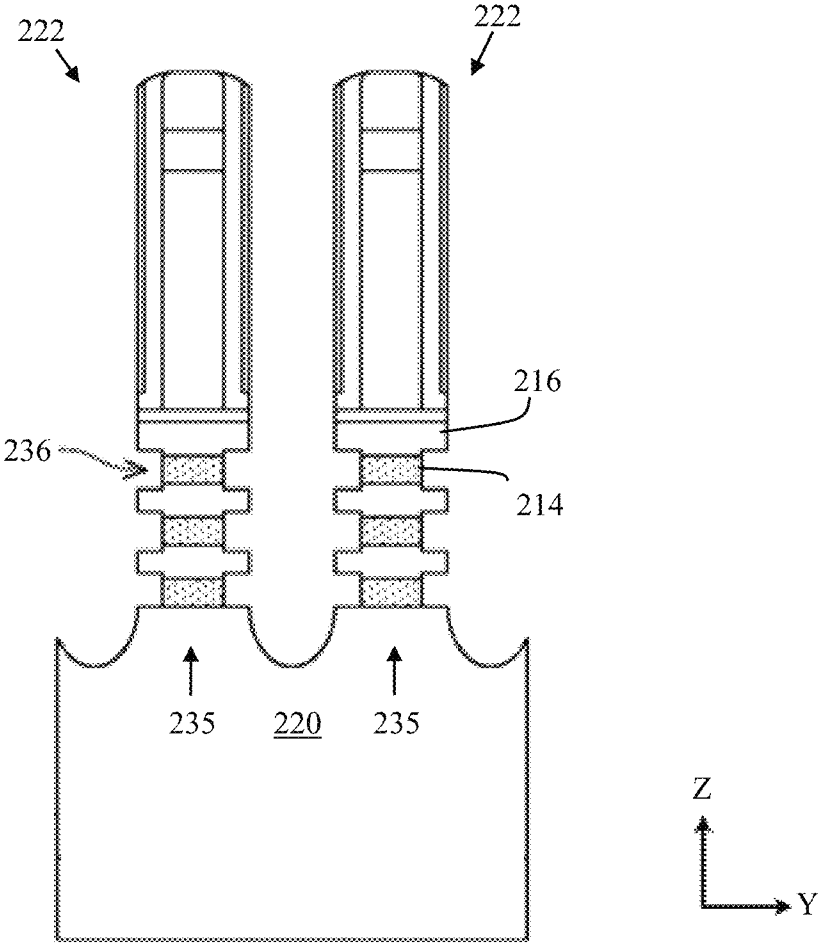
FIG. 7B is a cross-sectional view, taken along the y-axis, of the semiconductor device of FIG. 5 at the same stage of fabrication as FIG. 7A in accordance with some embodiments of the present disclosure.

As shown in FIGS. 7A and 7B, at operation S116, the method 100 (FIG. 1) etches the lateral ends of the epitaxial layers 214 in the y-direction, thereby forming cavities 236. It is noted that FIG. 7A, similar to FIG. 6A, shows only one sacrificial gate structure 222 and the adjacent portion of fin 220 and so that etching of the S/D region between the sacrificial gate structure 222 may be viewed.

FIG. 7B is a cross-sectional view along line 7-7 of the structure in FIG. 7A but, like FIGS. 5 and 6B, illustrates both sacrificial gate structures 222 and the adjacent fin 220.

The amount of etching of the epitaxial layers 214 is in a range from about 1 nm to about 4 nm in some embodiments. The epitaxial layers 214 may be selectively etched by using a wet etchant such as, but not limited to, ammonium hydroxide (NH4OH), tetramethylammonium hydroxide (TMAH), ethylenediamine pyrocatechol (EDP), potassium hydroxide (KOH), HF, O3, H2O2, or HCl solutions. Alternatively, the operation S116 may first selectively oxidize lateral ends of the epitaxial layers 214 that are exposed in the gaps 234 to increase the etch selectivity between the epitaxial layers 214 and 216. In some examples, the oxidation process may be performed by exposing the GAA device 200 to a wet oxidation process, a dry oxidation process, or a combination thereof.

Figure 8:
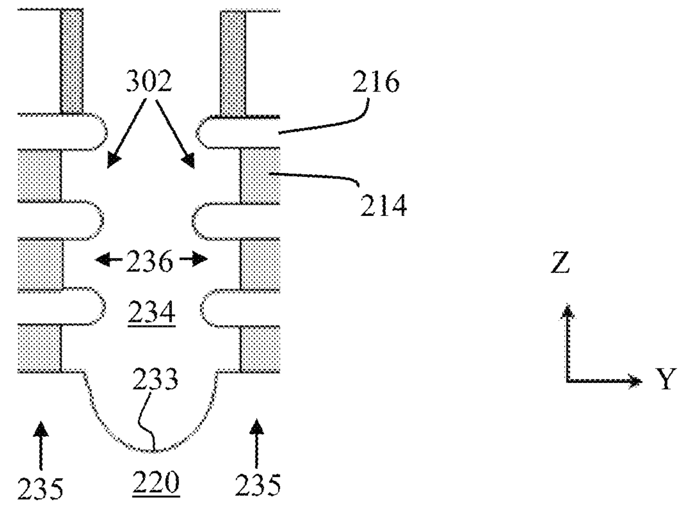
FIGS. 8 and 9 are cross-sectional views, taken along the y-axis, of the semiconductor device of FIG. 7B, focused on the gap between fin segments, at the further stages of fabrication in accordance with some embodiments of the present disclosure.

FIGS. 8-16 focus on the gap 234 located between fin segments 235 for further description of the method. As shown in FIG. 8, opposite gap sidewalls 302 are formed by the alternating semiconductor layers 214 and 216. Further, a bottom gap surface 233 is formed in the fin structure 220. As shown, semiconductor layers 216 may have rounded edges resulting from the etching process.

Figure 9:
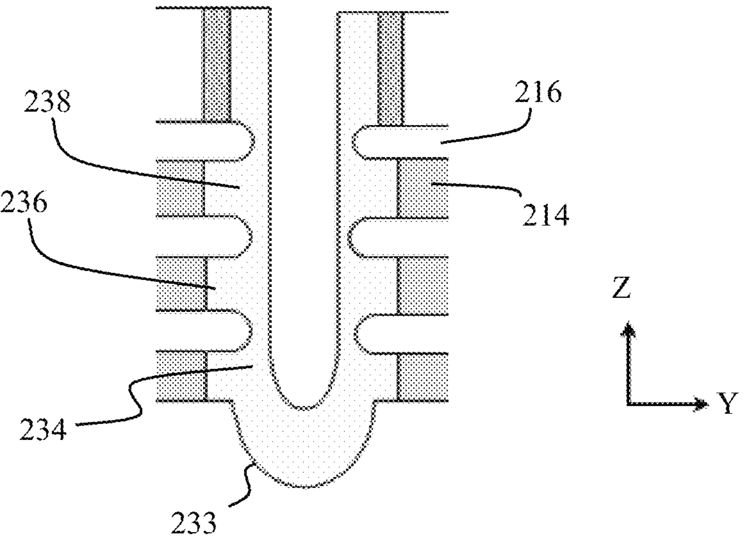

As shown in FIG. 9, method 100 (FIG. 1) may continue with operation S118 which forms an inner spacer material layer 238 in the gap 234 and on the lateral ends of the epitaxial layer 214, on the epitaxial layers 216, on the bottom gap surface 233 and in the cavities 236. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 may be formed by ALD or any other suitable method. The inner spacer material layer 238 may partially fill the gap 234, as shown, or may completely fill the gap. The inner spacer material layer 238 may have a thickness ranging from about 4 nm to about 6 nm, for example.

Figure 10:
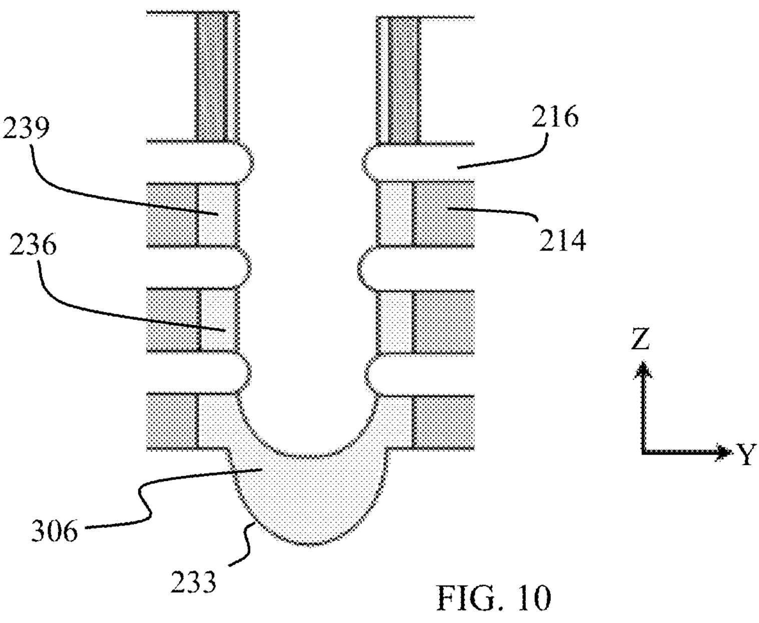
FIGS. 10 and 11, FIGS. 12 and 13, and FIGS. 14-16 are cross-sectional views, taken along the y-axis, of the semiconductor device of FIG. 9, focused on the gap between fin segments, at the further stages of fabrication in accordance with some embodiments of the present disclosure.
Figure 11:
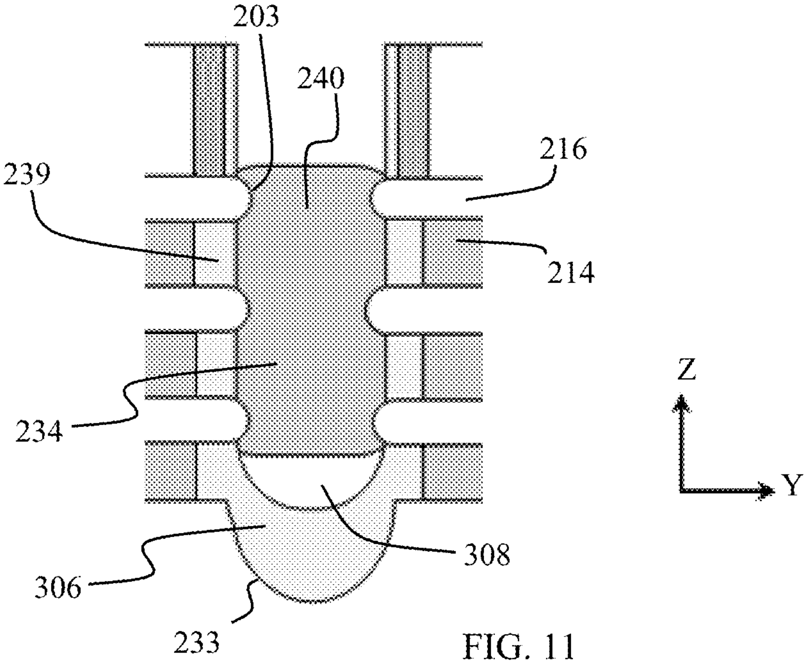
Figure 12:
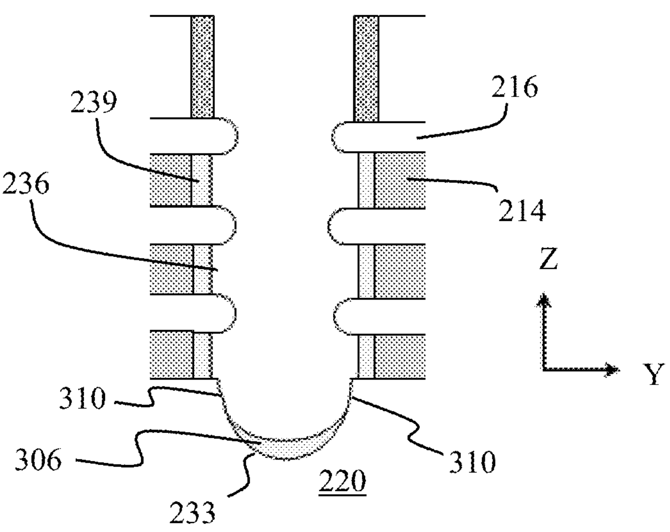
Figure 13:
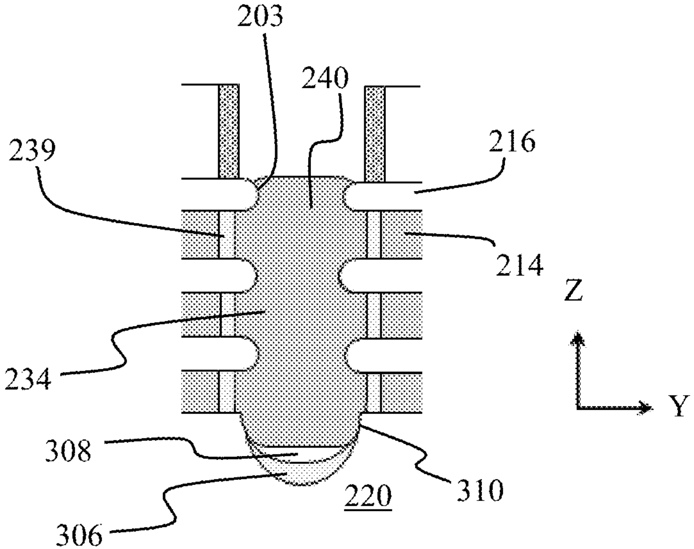
Figures 14, 15, 16:
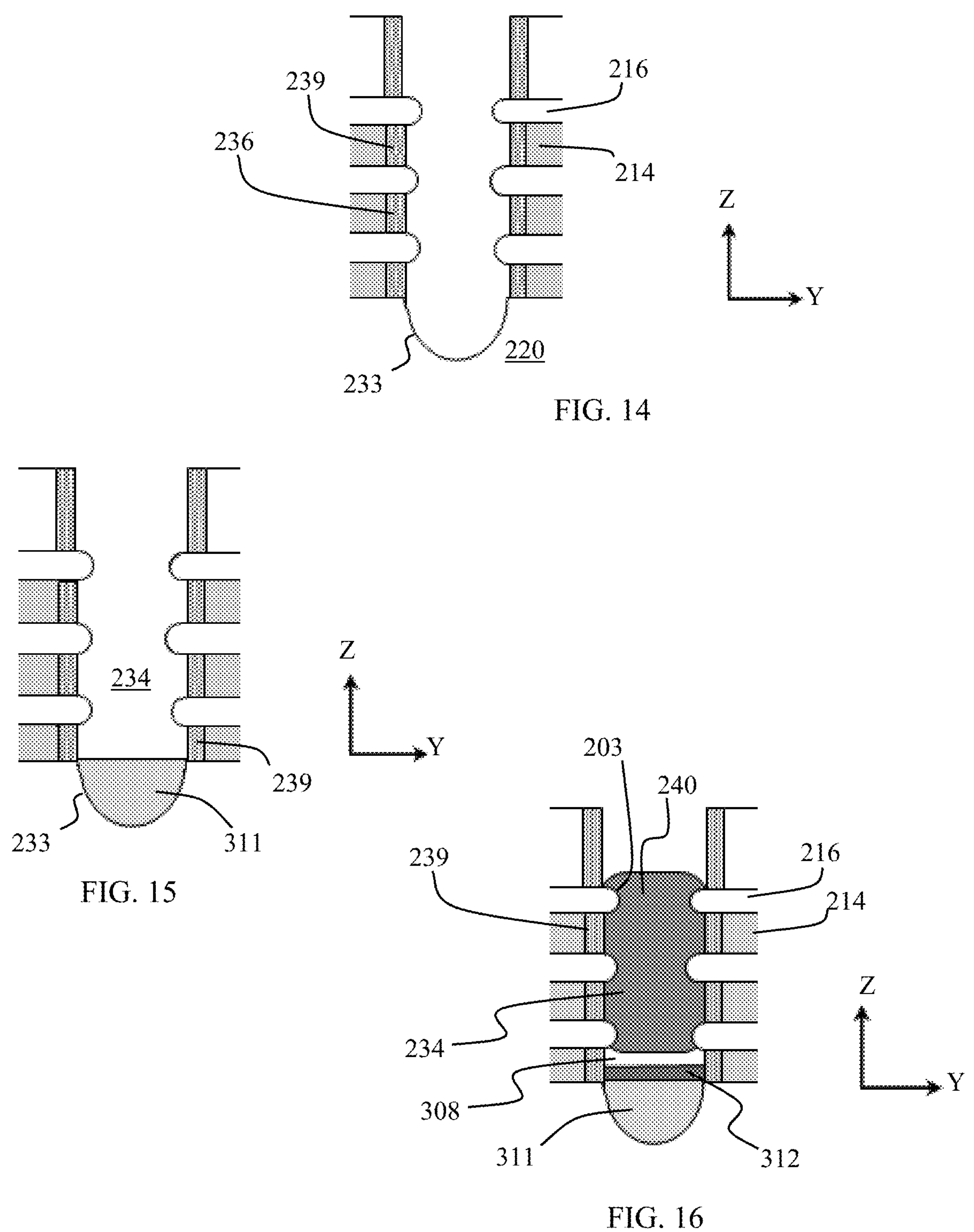

From the structure of FIG. 9, the method 100 (FIG. 1) may proceed differently according to different embodiments. For example, an embodiment is shown in FIGS. 10-11, an embodiment is shown in FIGS. 12-13, and an embodiment is shown in FIGS. 14-16.

In each embodiment, the method 100 (FIG. 1) continues with operation S120 including at least partially removing the inner spacer material layer 238 to form inner spacers 239. The inner spacer material layer 238 may be at least partially removed by an etching process. The etching process may be an anisotropic etching process such as a dry etching process. In some embodiments, the dry etching process using an etchant including a fluorine-containing gas (e.g., $SF_6$, $CF_4$, $CHF_3$, $CH_2F_2$, and/or $C_2F_6$), a chlorine-containing gas (e.g., $Cl_2$), a bromine-containing gas (e.g., HBr and/or $CHBR_3$), oxygen-containing gas (e.g., $O_2$), a helium-containing gas (e.g., He), an argon-containing gas (e.g., Ar), other suitable gases, or combinations thereof. By this etching, the inner spacer material layer 238 remains substantially within the cavities 236, because of small volumes of the cavities 236. Generally, plasma dry etching etches a layer in wide and flat areas faster than a layer in concave (e.g., holes, grooves, recesses and/or slits) portions. Thus, the inner spacer material layer 238 may remain inside the cavities 236. The remaining portion of the inner spacer material layer 238 in the cavities 236 is referred to as the inner spacers 239.

Further, in each embodiment, the method 100 (FIG. 1) continues with operation S126, which forms an epitaxial S/D structure 240 in each gap 234. The epitaxial S/D structures 240 may be formed by an epitaxial growth method using CVD, ALD or molecular beam epitaxy (MBE). The epitaxial S/D structures 240 include SiGe for p-type FETs, and silicon for n-type FETs. In some embodiments, epitaxial S/D structures 240 including SiGe for p-type FETs are formed at the same time as epitaxial S/D structures 240 including silicon for n-type FETs.

In each embodiment, the epitaxial S/D structures 240 are grown from the gap sidewalls 302 formed by the epitaxial semiconductor layers 216 of the fins 220.

Referring to FIG. 10, at operation S120, the method 100 (FIG. 1) partially removes the inner spacer material layer 238 to form inner spacers 239 in the cavities 236 and to form a bottom cover 306 completely covering the bottom gap surface 233. The bottom cover 306 may also be referred to as inner spacer residue, dielectric residue, insulating residue, dielectric material, insulator, or isolation. The bottom cover 306 may have a thickness greater than 1 nm. In some embodiments, the thickness of the bottom cover 306 ranges from 3 nm to 10 nm. The lowest inner spacers 239 and the bottom cover 306 may merge to form a continuous structure extending between the lowest epitaxial layers 216, as shown in FIG. 10, completely encapsulating the bottom gap surface 233.

At FIG. 11, the embodiment of the method 100 (FIG. 1) continues with operation S126, which forms an epitaxial S/D structure 240 in each gap 234. As shown, sidewalls of the epitaxial S/D structures 240 are in contact with, and grown from, the gap sidewalls 302 formed by the epitaxial semiconductor layers 216 of the fins 220. As further shown, sidewalls of the epitaxial S/D structures 240 may be in contact with inner spacers 239. Also, in the illustrated embodiment, the epitaxial S/D structures 240 are distanced from the bottom cover 306, thereby defining a bottom air gap 308.

Referring now to the embodiment of FIGS. 12-13, at operation S120, the method 100 (FIG. 1) partially removes the inner spacer material layer 238 to form inner spacers 239 in the cavities 236 and to form a bottom cover 306 that does not completely cover the bottom gap surface 233, as shown in FIG. 12. The bottom cover 306 may also be referred to as inner spacer residue, dielectric residue, insulating residue, dielectric material, insulator, or isolation. The bottom cover 306 may have a thickness greater than 1 nm. In some embodiments, the thickness of the bottom cover 306 ranges from 3 nm to 10 nm.

In the embodiment of FIGS. 12-13, the lowest inner spacers 239 are distanced from, and separate from, the bottom cover 306. As a result, the surfaces of opposite portions 310 of the fin 220 are exposed to the gap 234.

At FIG. 13, the embodiment of the method 100 (FIG. 1) continues with operation S126, which forms an epitaxial S/D structure 240 in each gap 234. As shown in FIG. 13, sidewalls of the epitaxial S/D structures 240 are in contact with, and grown from, both the gap sidewalls 302 formed by the epitaxial semiconductor layers 216 of the fins 220 and the exposed surfaces of opposite portions 310 of the fin 220. As further shown, sidewalls of the epitaxial S/D structures 240 may be in contact with inner spacers 239. Also, in the illustrated embodiment, the epitaxial S/D structures 240 are distanced from at least a central portion of the bottom cover 306, thereby defining a bottom air gap 308.

Referring now to the embodiment of FIGS. 14, 15 and 16, at operation S120, the method 100 (FIG. 1) partially removes the inner spacer material layer 238 to form inner spacers 239 in the cavities 236. As shown in FIG. 14, the inner spacer material layer below the lowest inner spacers 239 is completely removed, exposing the entire bottom gap surface 233 formed in the fin structure 220.

As shown in FIG. 15, at operation S124, the method 100 (FIG. 1) forms a bottom gap structure 311. An exemplary bottom gap structure 311 may include two layers. For example, a non-doped or lightly counter-doped ($<1\times10^{18}$ $cm^3$ semiconductor material, such as silicon, may be formed on the bottom gap surface 233. Further, the bottom gap structure 311 may include an upper layer of a dielectric insulator. As shown, the bottom gap structure 311 contacts each of the lowest inner spacers 239 and completely seals the bottom gap surface 233 from the remaining gap 234. As shown in FIG. 16, a dielectric insulator 312 may be formed on the bottom gap structure 311.

At FIG. 16, the embodiment of the method 100 (FIG. 1) continues with operation S126, which forms an epitaxial S/D structure 240 in each gap 234. As shown in FIG. 16, sidewalls of the epitaxial S/D structures 240 are in contact with, and grown from, the gap sidewalls 302 formed by the epitaxial semiconductor layers 216 of the fins 220. As further shown, sidewalls of the epitaxial S/D structures 240 may be in contact with inner spacers 239. Also, in the illustrated embodiment, the epitaxial S/D structures 240 are distanced from the bottom gap structure 311 and dielectric insulator 312, thereby defining a bottom air gap 308.

In FIGS. 2-16, the interleaved epitaxial layers 214 and 216 lie directly on an underlying portion of the fin 220, i.e., semiconductor material. It is also contemplated that a dielectric layer may be located directly under the bottom epitaxial layer 214 or 216. In such embodiments, the bottom gap surface 233 may be formed by the dielectric layer. In such embodiments, no bottom cover 306 or bottom gap structure 311 need be formed over the bottom gap surface 233. In such embodiments, the interleaved epitaxial layers 214 and 216 are formed with a (110) crystallographic orientation.

Referring now to 17A, 17B, 17C, and 17D, the epitaxial growth of the epitaxial S/D structures 240 is explained. Further, FIGS. 17A-17D illustrate how void formation is avoided or reduced in current embodiments.

Figure 17A:
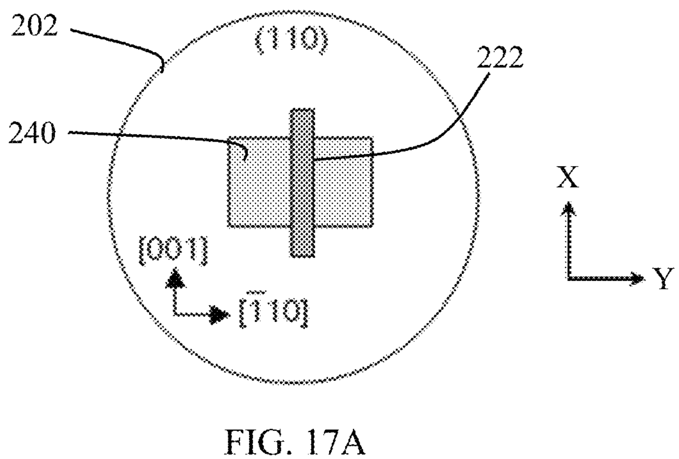
FIG. 17A is a top plan view of a semiconductor structure formed over a substrate having a (110) crystallographic orientation in accordance with some embodiments of the present disclosure.

FIG. 17A is a schematic top view of a semiconductor material or substrate 202 over which source/drain regions 240 are formed. Specifically, the source/drain regions 240 are grown on a fin (not shown in FIG. 17A) that lies under a gate structure 222. In the exemplary embodiment of FIG. 17A, the semiconductor material 202 has a (110) crystallographic orientation.

Figure 17B:
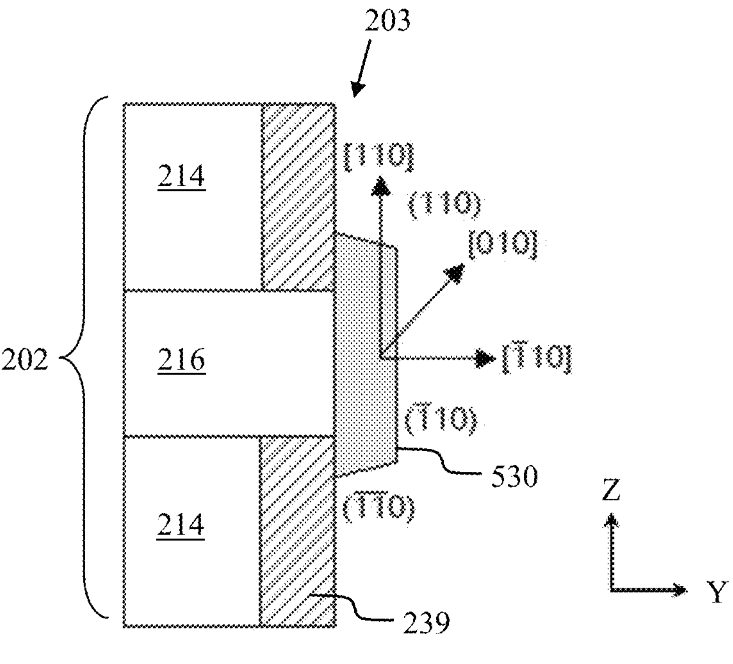
FIG. 17B is vertical cross-sectional view, taken along the x-axis, illustrating epitaxial growth in the structure of FIG. 17A in accordance with some embodiments of the present disclosure.

FIG. 17B is a schematic cross-sectional view of a vertical portion of the fin 202, during an initial stage of epitaxial growth of the source/drain regions 240. As shown, the fin 202 includes alternating semiconductor layers 214 and 216. Exemplary semiconductor layers 214 and 216 are epitaxially grown over the semiconductor material 202 and have the same (110) crystallographic orientation as semiconductor material 202.

Semiconductor layers 214 are recessed and capped with inner spacers 239. Thus, the fin 202 has a vertical sidewall 203 formed by semiconductor layer 216 and inner spacers 239. Inner spacers 239 are located both above and below the semiconductor layer 216 along the sidewall 203. The vertical sidewall 203 formed by semiconductor layer 216 has a $(\bar{1}10)$ crystallographic orientation. Thus, semiconductor layer 216 may form a channel region for a GAA device having a channel orientation of <110>.

FIG. 17B illustrates that when epitaxial material, such as a source/drain region 240, grows on the sidewall 203 of the semiconductor layer 216, {111} facets do not appear. Specifically, because the growth rate of {100} is greater than the growth rate of {110}, {111} facets do not result from the epitaxial growth. Rather, the source/drain region 240 propagates with facets 530 having a {110} crystallographic orientation.

Figure 17C:
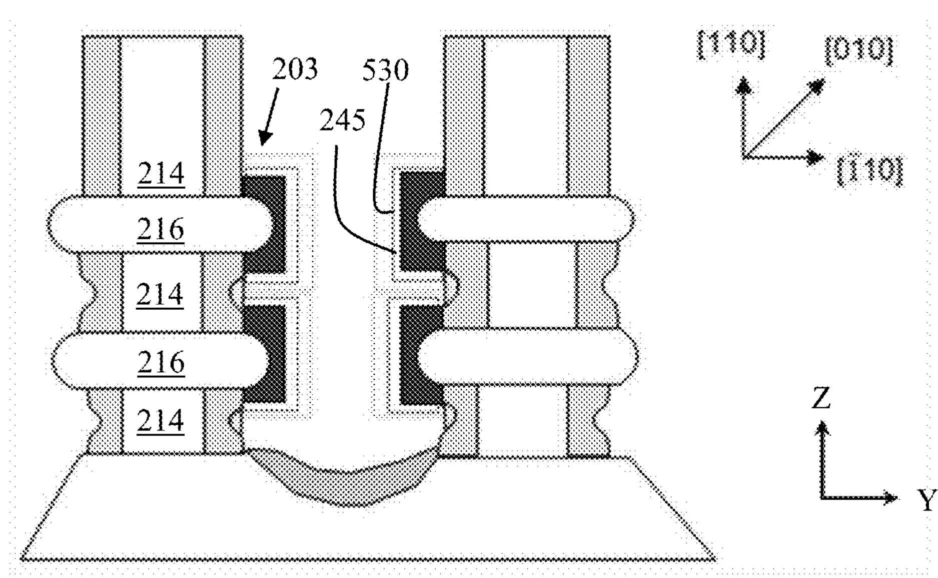
FIG. 17C is a cross-sectional view of the semiconductor structure of FIG. 17A, taken along the x-axis, at an initial epitaxial growth stage for forming a structure and focused on the gap between fin segments, in accordance with some embodiments of the present disclosure.

FIG. 17C is a schematic illustration, at an epitaxial growth stage for forming a structure similar to FIG. 11. In FIG. 17C, the initial epitaxial growth of portions 245 of epitaxial material from opposite sidewalls 302 is shown to occur along facets 530 having a {110} crystallographic orientation.

Figure 17D:
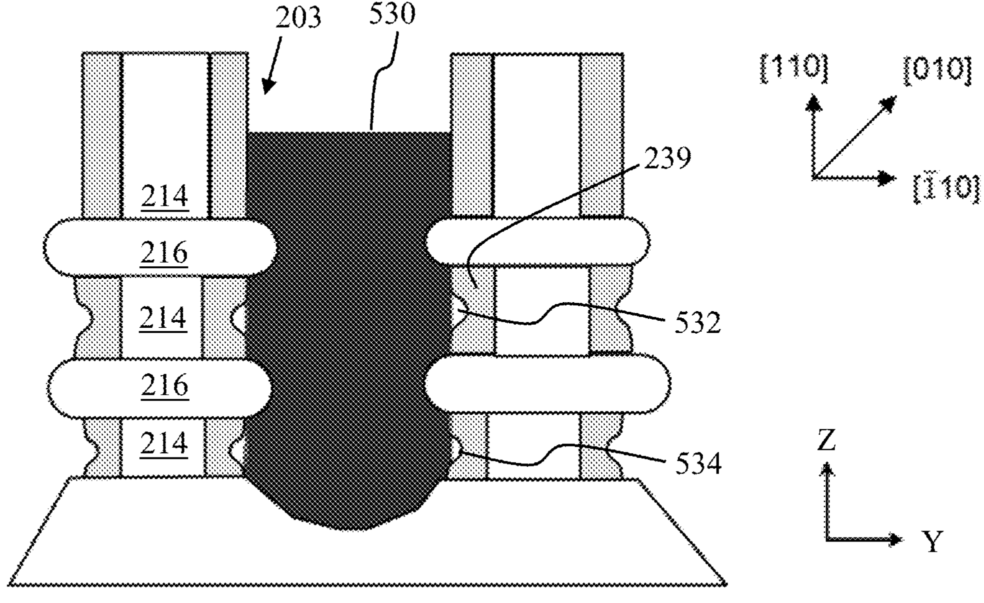
FIG. 17D is a cross-sectional view of the semiconductor structure of FIG. 17A, taken along the x-axis, at a further stage of epitaxial growth and focused on the gap between fin segments, similar to FIGS. 11, 13 and 16, in accordance with some embodiments of the present disclosure.

FIG. 17D is a schematic illustration, similar to FIG. 11, showing further growth of epitaxial material from opposite sidewalls 302. As shown, growth of epitaxial material with facets 530 having a {110} crystallographic orientation avoids or reduces the plane defects that occur in the structure of FIGS. 17A-17D. Specifically, when portions 245 of epitaxial material with facets 530 having a {110} crystallographic orientation merge, the merger occurs along an interface at a $[\bar{1}10]$ plane. Therefore, void formation is limited to voids having critical dimension of less than 1 nanometer.

Further, due to propagation of portions 245 of the epitaxial material with facets 530 having a {110} crystallographic orientation, air gaps 532 are enclosed between the epitaxial material 240 and the inner spacers 239. As shown, vertical sidewall 203 defined by the inner spacers 239 may include cavities or pockets 534 resulting from the etching process. Because the epitaxial material propagates with facets having a {110} crystallographic orientation, the pockets 534 are enclosed by the epitaxial material to define air gaps 532.

Cross-referencing FIGS. 17C and 17D, it may be seen that the epitaxial structure is formed by merging epitaxial portions grown on opposite sidewalls. The epitaxial portions from opposite sidewalls merge at a plane having a substantially {110} crystallographic orientation. Further, it may be seen that the epitaxial structure is formed by merging a lower epitaxial section grown on a lower epitaxial layer 216 and an upper epitaxial section grown on an upper epitaxial layer 216. The lower and upper epitaxial sections merge at a plane having a substantially {110} crystallographic orientation.

Figure 18:
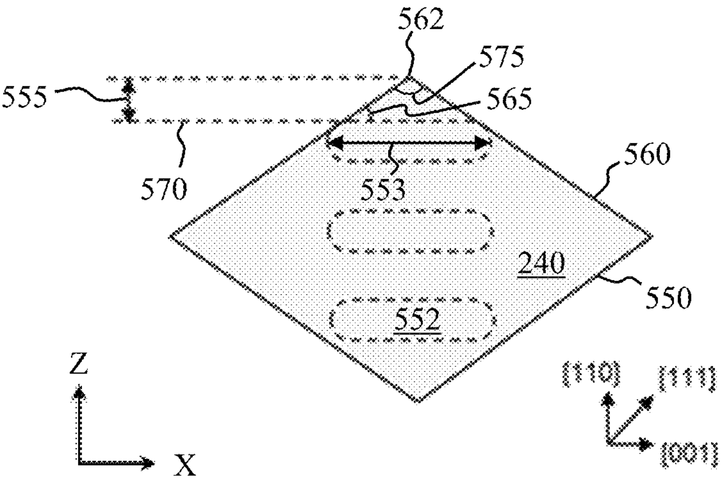
FIG. 18 is a diagrammatic cross-sectional view of an epitaxial structure, taken along the y-axis, in accordance with some embodiments of the present disclosure.

FIG. 18 is a cross-sectional view of an epitaxial structure 240, in isolation and taken, for example, along the y-direction through the epitaxial structure 240 of FIG. 11, 13, or 16. As shown, in the y-direction cross-section, the epitaxial structure 240 has a perimeter 550 having a diamond-shape. In FIG. 18, the y-direction profile 552 of the channel regions of the semiconductor sheets, i.e., epitaxial layers 216, that lie in a plane in front of or behind the illustrated cross-section are illustrated in phantom. The epitaxial structure 240 is grown to completely cover each channel region profile 552. In other words, each y-direction channel profile 552 fits within the epitaxial feature perimeter 550. As shown, each channel region profile 552 has a width 553 in the x-direction.

As shown, in the y-direction cross-section, the epitaxial structure 240 includes two intersecting top surfaces 560. The top surfaces 560 meet one another at a top edge 562. In certain embodiments, a plane substantially perpendicular to the substrate and to the sidewall of the fin structure intersects the top edge 562 at a line substantially parallel to the surface of the substrate.

As shown, horizontal planes 570 are defined and are substantially parallel to the substrate. The top surface of the uppermost channel region profile 552 is co-planar with the labeled horizontal plane 570 in FIG. 18.

Further, each top surface 560 forms a side or base internal angle 565 with the horizontal plane 570. In other words, each top surface intersects the horizontal plane 570 at a base internal angle 565. Due to the formation of the epitaxial structure 240 with facets having a {110} crystallographic orientation, each base internal angle 565 is less than 50°, for example less than 45°, such as less than 40°, for example less than 36°, or about 35.3°.

The base internal angle 565 is less than the base internal angle of an epitaxial feature formed with a (001) crystallographic orientation. For an epitaxial feature formed with a (001) crystallographic orientation, each corresponding base internal angle is 54.7°.

Because the base internal angle 565 in embodiments herein is less than in a comparative structure including epitaxial features formed with a (001) crystallographic orientation, the necessary height of the epitaxial structure 240 is less. Specifically, the minimum necessary height 555, defined as the distance from the top edge 562 to the uppermost channel region profile 552, is reduced as compared to epitaxial features formed on semiconductor material having a (001) crystallographic orientation. This may result in more efficient use of chip space Likewise, the top edge 562 is formed with a top internal angle 575. Due to the formation of the epitaxial structure 240 with facets having a {110} crystallographic orientation, an exemplary top internal angle 575 is greater than 80°, for example greater than 90°, such as greater than 100°, for example greater than 105°, or about 109.4°.

The top internal angle 575 is greater than the top internal angle of an epitaxial feature formed with a (001) crystallographic orientation. For an epitaxial feature formed with a (001) crystallographic orientation, each corresponding top internal angle is 70.6°.

With the decrease in the base internal angles 565, and increase in the top internal angle 575, it is understood that an exemplary epitaxial structure 240 may grow wider, in the x-direction, and less high, in the z-direction, than a comparative epitaxial feature formed with a (001) crystallographic orientation.

Figure 19:
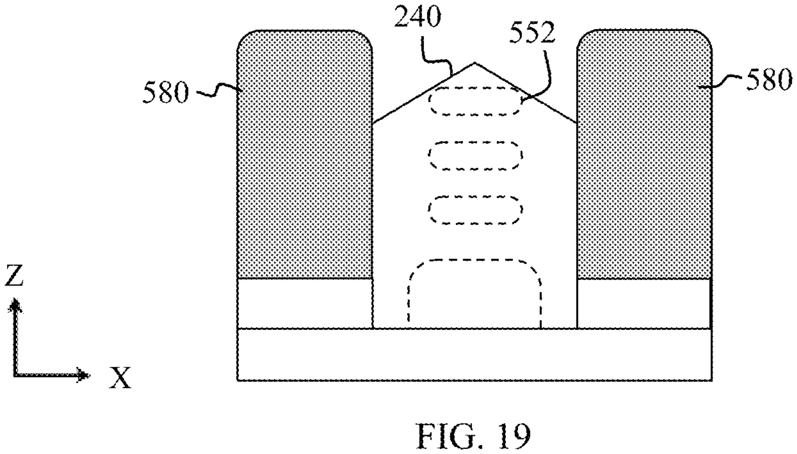
FIG. 19 is a diagrammatic cross-sectional view, taken along the y-axis, of a semiconductor device at another stage of fabrication in accordance with some embodiments of the present disclosure.

Certain embodiments may prevent the relative increase in width (in the x-direction) of the epitaxial structure 240. For example, as shown in FIG. 19, method 100 (FIG. 1) may include operation S122 which forms parallel sacrificial dielectric blocks 580 at a desired distance, in the x-direction, from the channel regions profiles 552. The dielectric blocks 580 may be formed from one or more dielectric materials. Suitable dielectric materials for the dielectric blocks may include silicon oxides, silicon nitrides, silicon carbides, fluorosilicate glass (FSG), low-K dielectric materials, and/or other suitable dielectric materials. The dielectric material may be deposited and patterned by any suitable technique.

Thereafter, in embodiments in which operation S122 has formed sacrificial dielectric blocks 580, operation S122 later forms an epitaxial S/D structure 240 in each gap 234 in operation S126. Growth of the epitaxial S/D structure 240 in the x-direction is limited by the dielectric blocks 580, as shown in FIG. 19.

Further, due to the formation of the epitaxial structure 240 with facets having a {110} crystallographic orientation and by confining growth of the epitaxial S/D structure 240 in the x-direction by the dielectric blocks 580, the cross-section of the epitaxial structure is smaller than that of an epitaxial feature formed with a (001) crystallographic orientation. Accordingly, exemplary embodiments of epitaxial structures 240 have a reduced parasitic capacitance (Cpara) as compared to epitaxial features formed with a (001) crystallographic orientation.

While the relative increase in width (in the x-direction) of the epitaxial structure 240 may be avoided as described above, the relative decrease in height (in the z-direction) provides benefits in the design and layout of devices including epitaxial structures 240 with facets having a {110} crystallographic orientation. For example, FIG. 20 illustrates two epitaxial structures 240: first epitaxial structure 241 and second epitaxial structure 242.

Figure 20:
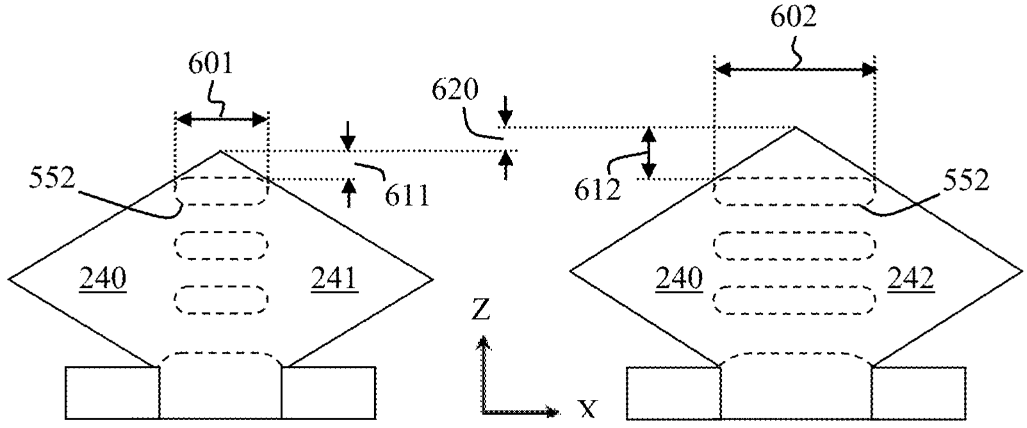
FIG. 20 is a diagrammatic cross-sectional view, taken along the y-axis, of two exemplary semiconductor devices with different channel region widths, to illustrate the resulting effect on epitaxial structure height, in accordance with some embodiments of the present disclosure.

As shown in FIG. 20, first epitaxial structure 241 is formed around channel regions 552 that have a first width 601 in the x-direction. To cover the uppermost channel region 552, the first epitaxial structure 241 must be formed with a top edge located at a minimum height 611 over the uppermost channel region 552. With the given top internal angle and base internal angles required by the {110} crystallographic orientation of the epitaxial structure 241, the height 611 is a function of the width 601 of the uppermost channel region 552.

As further shown in FIG. 20, second epitaxial structure 242 is formed around channel regions 552 that have a second width 602 in the x-direction. To cover the uppermost channel region 552, the second epitaxial structure 242 must be formed with a top edge located at a minimum height 612 over the uppermost channel region 552. Again, with the given top internal angle and base internal angles required by the {110} crystallographic orientation of the epitaxial structure 242, the height 612 is a function of the width 602 of the uppermost channel region 552.

FIG. 20 illustrates that height difference 620 between embodiments having width 601 and width 602. In order to design a device with channel regions of an increased width, such as width 602, as compared to a device with channel regions of width 601, the height of the epitaxial structure need only increase by height difference 620. This is an improvement over comparative epitaxial feature formed with a (001) crystallographic orientation.

Referring back to FIG. 18, in general, the relationship between the height 555 and width 553 can be explained by the equation:

Tangent(base interior angle)=(Height/(Width/2))

Thus, in exemplary embodiments herein:

Tangent(35.3°)=(Height/(Width/2))

0.708=(Height/(Width/2))

0.708(Width/2)=Height 0.354 Width=Height

As a result, for exemplary embodiments with epitaxial structures 242 having a {110} crystallographic orientation, an increase in width requires a height increase that is only 35.4% as great as the width increase.

For comparative epitaxial feature formed with a (001) crystallographic orientation, the relationship between the height of epitaxial material over the uppermost channel region and the channel region width can be explained by the equation:

Tangent(54.7°)=(Height/(Width/2))

1.412=(Height/(Width/2))

1.412(Width/2)=Height 0.706 Width=Height

Thus, for comparative embodiments with epitaxial features formed with a (001) crystallographic orientation, an increase in width requires a height increase that is 70.6% as great as the width increase.

As is evident, an equivalent increase in width results in a height increase for exemplary embodiments with {110} crystallographic oriented epitaxial material that is about half of the height increase for comparative embodiments with (001) crystallographic oriented epitaxial material. As result, design restraints, particularly related to vertical chip space, are alleviated in exemplary embodiments.

As described herein, an exemplary embodiment provides epitaxial structures, and methods for growing epitaxial structures, that propagate with facets having a {110} crystallographic orientation.

An exemplary method includes forming a fin structure on a substrate, wherein the fin structure includes a semiconductor material having substantially a {110} crystallographic orientation. Further, the method includes etching a portion of the fin structure to expose a sidewall portion of the semiconductor material. Also, the method includes growing an epitaxial structure on the sidewall portion of the semiconductor material, wherein the epitaxial structure propagates with facets having a {110} crystallographic orientation.

In certain embodiments, the fin structure includes a lower material layer under the semiconductor material and an upper material layer over the semiconductor material, and etching the portion of the fin structure to expose the sidewall portion of the semiconductor material includes etching a recess into the fin structure to expose a side surface of the fin structure, etching the side surface of the fin structure and selectively removing portions of the lower material layer and the upper material layer, forming a spacer layer over the side surface of the fin structure, and etching the spacer layer to expose the sidewall portion of the semiconductor material, wherein the spacer layer remains covering the lower material layer and the upper material layer. Further, in such embodiments, etching the spacer layer may include forming a pocket in the spacer layer, and growing the epitaxial structure on the sidewall portion of the semiconductor material may include enclosing an air gap in the pocket.

In certain embodiments, growing the epitaxial structure on the sidewall portion of the semiconductor material includes forming the epitaxial structure with two top surfaces, wherein each top surface intersects a horizontal plane substantially parallel to the substrate at an angle less than 45°.

In certain embodiments, growing the epitaxial structure on the sidewall portion of the semiconductor material includes forming the epitaxial structure with a top edge, wherein a plane substantially perpendicular to the substrate and to the sidewall portion intersects the top edge at a line substantially parallel to the substrate.

In certain embodiments, the epitaxial structure is only grown on the sidewall portion of the semiconductor material.

In certain embodiments, the epitaxial structure is grown on the sidewall portion of the semiconductor material and on a portion of the substrate underlying the epitaxial structure.

Another exemplary method includes forming a recess, wherein the recess is bordered by opposite sidewalls of a semiconductor stack, and forming an epitaxial structure in the recess by merging epitaxial portions grown on the respective opposite sidewalls. The epitaxial portions merge at an interface having a substantially {110} crystallographic orientation.

In certain embodiments of the method, the semiconductor stack includes: a first layer of a first semiconductor material; a first layer of a second semiconductor material over the first layer of the first semiconductor material; a second layer of the first semiconductor material over the first layer of the second semiconductor material; and a second layer of the second semiconductor material over the second layer of the first semiconductor material. In the method, the epitaxial portions are grown on the first layer and the second layer of the second semiconductor material.

In certain embodiments, each epitaxial portion is formed by merging a lower epitaxial section grown on the first layer of the second semiconductor material and an upper epitaxial section grown on the second layer of the second semiconductor material. The lower and upper epitaxial sections merge at a plane having a substantially {110} crystallographic orientation.

In certain embodiments, forming the recess includes forming a pocket in the opposite sidewalls of the semiconductor stack between the first layer and the second layer of the second semiconductor material, and forming the epitaxial structure in the recess includes enclosing an air gap in each pocket.

In certain embodiments, if a void is formed at an interface between the epitaxial portions, the void has a critical dimension of less than 1 nanometer.

In certain embodiments, the epitaxial structure is formed with a top surface having a substantially {110} crystallographic orientation.

In certain embodiments, the recess is bordered by a bottom surface extending between the opposite sidewalls, and the method further includes, before forming the epitaxial structure in the recess, forming a layer over the bottom surface.

In certain embodiments, the recess is bordered by a bottom surface extending between the opposite sidewalls, and forming the epitaxial structure in the recess includes enclosing an air gap between the epitaxial structure and the bottom surface.

An exemplary structure includes a substrate; a first sidewall overlying the substrate; a second sidewall overlying the substrate, wherein the second sidewall faces the first sidewall, and wherein a gap is defined between the first sidewall and the second sidewall; and an epitaxial structure grown on the first sidewall and the second sidewall and in the gap with facets having a {110} crystallographic orientation.

In certain embodiments, the epitaxial structure encloses an air gap between the substrate and the epitaxial structure.

In certain embodiments, the epitaxial structure has two top surfaces, and each top surface intersects a horizontal plane substantially parallel to the substrate at an angle less than 45°.

In certain embodiments, the epitaxial structure has a top edge, and a plane substantially perpendicular to the substrate and to the first and second sidewalls intersects the top edge at a line substantially parallel to the substrate.

In certain embodiments, the epitaxial structure does not have {111} facets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a fin structure on a substrate, wherein the fin structure includes a semiconductor material having substantially a {110} crystallographic orientation, wherein the fin structure includes nanosheets formed from the semiconductor material having the {110} crystallographic orientation, wherein the nanosheets are separated from one another by gaps;

etching a portion of the fin structure to expose a sidewall portion and a bottom surface of the semiconductor material, wherein the sidewall portion of the semiconductor material is defined by sidewall portions of the nanosheets;

forming intermittent dielectric segments over the sidewall portion and the bottom surface; and while the intermittent dielectric segments cover regions of the sidewall portion and the bottom surface, growing an epitaxial structure on the sidewall portion of the semiconductor material not covered by the intermittent dielectric segments, wherein the epitaxial structure propagates with facets having a {110} crystallographic orientation, wherein growing the epitaxial structure on the sidewall portion comprises growing the epitaxial structure on the sidewall portions of the nanosheets, wherein a first portion of the epitaxial structure grows on a sidewall portion of a first nanosheet and a second portion of the epitaxial structure grows on a sidewall portion of a second nanosheet, and wherein the first portion and the second portion merge along an interface at a [$\bar{1}$10] plane, and wherein the epitaxial structure is formed with two top surfaces, wherein each top surface intersects a horizontal plane substantially parallel to the substrate at an angle less than 45°.

2. The method of claim 1, wherein the fin structure includes a lower material layer under the semiconductor material and an upper material layer over the semiconductor material, and wherein etching the portion of the fin structure to expose the sidewall portion of the semiconductor material comprises:

etching a recess into the fin structure to expose a side surface of the fin structure; and etching the side surface of the fin structure and selectively removing portions of the lower material layer and the upper material layer;

wherein forming the intermittent dielectric segments over the sidewall portion and the bottom surface comprises:

forming a dielectric layer over the side surface of the fin structure and over the bottom surface; and etching the dielectric layer to expose the sidewall portion of the semiconductor material, wherein the intermittent dielectric segments remain covering the lower material layer and the upper material layer and the bottom surface.

3. The method of claim 2, wherein etching the dielectric layer comprises forming a pocket in the dielectric layer, and wherein growing the epitaxial structure on the sidewall portion of the semiconductor material comprises enclosing an air gap in the pocket, wherein, due to propagation of the epitaxial structure with facets having the {110} crystallographic orientation, a lateral air gap is enclosed between the epitaxial structure and an inner spacer adjacent to the sidewall portion.

4. The method of claim 1, wherein growing the epitaxial structure on the sidewall portion of the semiconductor material comprises forming the epitaxial structure with two top surfaces, wherein each top surface intersects a horizontal plane substantially parallel to the substrate at an angle of about 35.3°.

5. The method of claim 1, wherein growing the epitaxial structure on the sidewall portion of the semiconductor material comprises forming the epitaxial structure with a top edge, wherein a plane substantially perpendicular to the substrate and to the sidewall portion intersects the top edge at a line substantially parallel to the substrate, wherein the two top surfaces meet at the top edge to form an internal angle greater than 90°.

6. The method of claim 1, wherein:

the nanosheets include a first nanosheet and a second nanosheet;

while growing the epitaxial structure on the sidewall portions of the nanosheets, a first portion of the epitaxial structure grows on the sidewall portion of the first nanosheet;

while growing the epitaxial structure on the sidewall portions of the nanosheets, a second portion of the epitaxial structure grows on the sidewall portion of the second nanosheet; and while growing the epitaxial structure on the sidewall portions of the nanosheets, the first portion and the second portion merge along an interface at a [$\bar{1}$10] plane, wherein voids formed at the interface between the first portion and the second portion each have a critical dimension of less than 1 nanometer.

7. The method of claim 6, wherein:

an inner spacer is located between the first nanosheet and the second nanosheet; and when the first portion and the second portion merge, an air gap is defined between the epitaxial structure and the inner spacer, wherein the air gap is formed by the epitaxial structure enclosing a pocket in a sidewall adjacent to the inner spacer, the pocket being enclosed due to propagation of the epitaxial structure with facets having the {110} crystallographic orientation.

8. The method of claim 1, wherein the fin structure further includes inner spacers adjacent to the nanosheets along the sidewall portions, and wherein lateral air gaps are enclosed between the epitaxial structure and the inner spacers due to propagation of the epitaxial structure with facets having the {110} crystallographic orientation.

9. A method, comprising:

forming a fin structure on a substrate, wherein the fin structure includes a semiconductor material having substantially a {110} crystallographic orientation;

etching a portion of the fin structure to expose a sidewall portion of the semiconductor material; and growing an epitaxial structure on the sidewall portion of the semiconductor material, wherein the epitaxial structure propagates with facets having a {110} crystallographic orientation, wherein the epitaxial structure is only grown on the sidewall portion of the semiconductor material, wherein the fin structure further includes an inner spacer adjacent to the semiconductor material along the sidewall portion, and wherein a lateral air gap is enclosed between the epitaxial structure and the inner spacer, the lateral air gap resulting from the epitaxial structure enclosing a cavity adjacent to the inner spacer due to propagation of the epitaxial structure with facets having the {110} crystallographic orientation.

10. The method of claim 9, wherein:

the fin structure includes nanosheets formed from the semiconductor material having substantially a {110} crystallographic orientation, wherein the nanosheets are separated from one another by gaps;

the sidewall portion of the semiconductor material is defined by sidewall portions of the nanosheets; and growing the epitaxial structure on the sidewall portion of the semiconductor material comprises growing the epitaxial structure on the sidewall portions of the nanosheets.

11. The method of claim 9, wherein {111} facets do not appear during growth of the epitaxial structure.

12. The method of claim 9, wherein the epitaxial structure has a diamond-shaped perimeter in a cross-section perpendicular to the sidewall portion, and wherein the two top surfaces of the epitaxial structure meet at a top edge having an internal angle greater than 90°.

13. A method, comprising:

forming a recess, wherein the recess is bordered by opposite sidewalls of a semiconductor stack comprising nanosheets having substantially a {110} crystallographic orientation, and by a bottom surface extending between the opposite sidewalls; and forming an epitaxial structure in the recess by merging epitaxial portions grown on the respective opposite sidewalls to form a merged epitaxial structure, wherein the epitaxial portions merge at an interface having a substantially {110} crystallographic orientation, wherein each of the epitaxial portions propagates with facets having a {110} crystallographic orientation, wherein the merged epitaxial structure terminates at a lowest surface that is distanced from the bottom surface by an air gap, and wherein the merged epitaxial structure includes two intersecting top surfaces, each intersecting a horizontal plane substantially parallel to a substrate at an angle less than 45°.

14. The method of claim 13, wherein the semiconductor stack comprises:

a first layer of a first semiconductor material;

a first layer of a second semiconductor material over the first layer of the first semiconductor material;

a second layer of the first semiconductor material over the first layer of the second semiconductor material; and a second layer of the second semiconductor material over the second layer of the first semiconductor material, wherein the epitaxial portions are grown on the first layer and the second layer of the second semiconductor material, wherein each of the first layer and the second layer of the first semiconductor material and the first layer and the second layer of the second semiconductor material has a {110} crystallographic orientation, and wherein the first semiconductor material is SiGe and the second semiconductor material is silicon.

15. The method of claim 14, wherein, each epitaxial portion is formed by merging a lower epitaxial section grown on the first layer of the second semiconductor material and an upper epitaxial section grown on the second layer of the second semiconductor material, wherein the lower and upper epitaxial sections merge at a plane having a substantially {110} crystallographic orientation, wherein {111} facets do not appear during epitaxial growth of the lower epitaxial section and the upper epitaxial section.

16. The method of claim 13, wherein, voids are formed at an interface between the epitaxial portions, and each void has a critical dimension of less than 1 nanometer.

17. The method of claim 13, wherein the epitaxial structure is formed with a top surface having a substantially {110} crystallographic orientation and wherein the merged epitaxial structure has a diamond-shaped perimeter in a cross-section taken along a direction perpendicular to the opposite sidewalls.

18. The method of claim 13, further comprising forming a bottom cover completely covering the bottom surface between the opposite sidewalls, wherein the air gap is located between the merged epitaxial structure and the bottom cover.

19. The method of claim 13, wherein:

the epitaxial structure is a source/drain feature;

voids are formed at an interface between the epitaxial portions, and each void has a critical dimension of less than 1 nanometer;

the epitaxial structure is formed with a top surface having a substantially {110} crystallographic orientation;

the recess is bordered by a bottom surface extending between the opposite sidewalls;

the method further comprises, before forming the epitaxial structure in the recess, forming a layer over the bottom surface; and the air gap is located between the epitaxial structure and the layer over bottom surface.

20. The method of claim 13, wherein the two intersecting top surfaces meet at a top edge having an internal angle greater than 90°.

* * * * *